United States Patent
Barbezat et al.

(10) Patent No.: US 7,678,428 B2
(45) Date of Patent: *Mar. 16, 2010

(54) PLASMA SPRAYING METHOD

(75) Inventors: Gerard Barbezat, Opfikon (CH); Arno Refke, Mellingen (CH); Michael Loch, Wehr (DE)

(73) Assignee: Sulzer Metco AG, Wohlen (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/509,850

(22) PCT Filed: Mar. 18, 2003

(86) PCT No.: PCT/CH03/00175

§ 371 (c)(1),
(2), (4) Date: Sep. 30, 2004

(87) PCT Pub. No.: WO03/087422

PCT Pub. Date: Oct. 23, 2003

(65) Prior Publication Data

US 2005/0129965 A1 Jun. 16, 2005

(51) Int. Cl.
C23C 4/10 (2006.01)
C23C 4/12 (2006.01)
H05H 1/24 (2006.01)
H05H 1/26 (2006.01)

(52) U.S. Cl. .................. 427/454; 427/446; 427/453; 427/8; 427/562; 427/564; 427/569; 427/576

(58) Field of Classification Search .................. 427/454
See application file for complete search history.

(56) References Cited

U.S. PATENT DOCUMENTS 5,201,939 A 4/1993 Siemers (Continued)

FOREIGN PATENT DOCUMENTS

DE 3914722 A1 11/1990

(Continued)

OTHER PUBLICATIONS

Hilscher Gottfried; "Krupp Lanciert Vakuumplasmaspritzen für den Maschinenbau"; *Technische Rundschau*; Nov. 16, 1990; pp. 60-61; vol. 82, No. 46; Bern, Switzerland.

(Continued)

*Primary Examiner*—Katherine A Bareford
(74) *Attorney, Agent, or Firm*—Townsend and Townsend and Crew, LLP

(57) ABSTRACT

A method of forming a thermally insulating layer system on a metallic substrate surface is disclosed. The method includes: forming a plasma beam; introducing a coating material in the form of a powder having particles in the range between 1 and 50 μm, carried by a delivery gas into the plasma beam, so as to form a powder beam; defocusing the powder beam by using the plasma beam with a sufficiently high specific enthalpy and by maintaining a process pressure between 50 and 2000 Pa for at least partially melting and vaporizing at least 5% by weight of the powder, so as to form a vapor phase cloud; and forming from the vapor phase cloud onto the metallic substrate surface an insulating layer, being a part of the insulating layer system, having an anisotropic columnar microstructure having elongate particles; wherein the anisotropic columnar microstructure is aligned substantially perpendicular to the metallic substrate surface and low-density transition regions with little material delimit the elongate particles relative to one another.

23 Claims, 1 Drawing Sheet

U.S. PATENT DOCUMENTS

| | | | |
|---|---|---|---|
| 5,332,601 A | | 7/1994 | Varacalle, Jr. et al. |
| 5,660,885 A | * | 8/1997 | Hasz et al. ............... 427/374.5 |
| 5,792,267 A | * | 8/1998 | Marszal et al. .............. 118/500 |
| 5,817,372 A | * | 10/1998 | Zheng ........................ 427/456 |
| 5,824,423 A | * | 10/1998 | Maxwell et al. ............. 428/623 |
| 5,830,586 A | | 11/1998 | Gray et al. |
| 5,853,815 A | * | 12/1998 | Muehlberger ............... 427/446 |
| 7,482,035 B2 | * | 1/2009 | Schmid et al. ................ 427/10 |
| 2004/0234687 A1 | * | 11/2004 | Schmid et al. ........... 427/248.1 |

FOREIGN PATENT DOCUMENTS

| | | |
|---|---|---|
| DE | 4114962 A1 | 11/1992 |
| EP | 1154033 A2 | 11/2001 |
| JP | 59-70757 * | 4/1984 |
| JP | 60092461 A | 5/1985 |
| JP | 2000119835 A | 4/2000 |
| WO | WO 96/06200 A1 | 2/1996 |

OTHER PUBLICATIONS

Sampath, S, et al.; "Structure and properties of vacuum plasma sprayed hard coatings"; *Mémoires et Études Scientifiques de la Revue de Métallurgie*; May 1991; pp. 289-294; vol. 88, No. 5; Paris, France.

Sevostianov, Igor and Mark Kachanov; "Anisotropic Thermal Conductivities of Plasma-Sprayed Thermal Barrier Coatings in Relation to the Microstructure"; *Journal of Thermal Spray Technology*; Dec. 2000; pp. 478-482; vol. 9, No. 4.

Zhu, Yingchun and Chuanxian Ding; "Characterization of plasma sprayed nano-titania coatings by impedance spectroscopy", *Journal of the European Ceramic Society*; 2000; pp. 127-132; vol. 20; Elsevier Science Ltd.

Neiser, R.A., "Evaluation of plasma-sprayed tungsten for fusion reactors,", 1993, Journal of Thermal Spray Technology, vol. 2, No. 4, 393-399.

Hamatani et al. "The Microstructure of Functionally Gradient Materials Made by Plasma Spraying," Database WPI, Derwant Publications, London, GB, AN 12:223972 & Yosetsu Gakkai Ronnunshu, 11(4), 576-582, (1993).

* cited by examiner

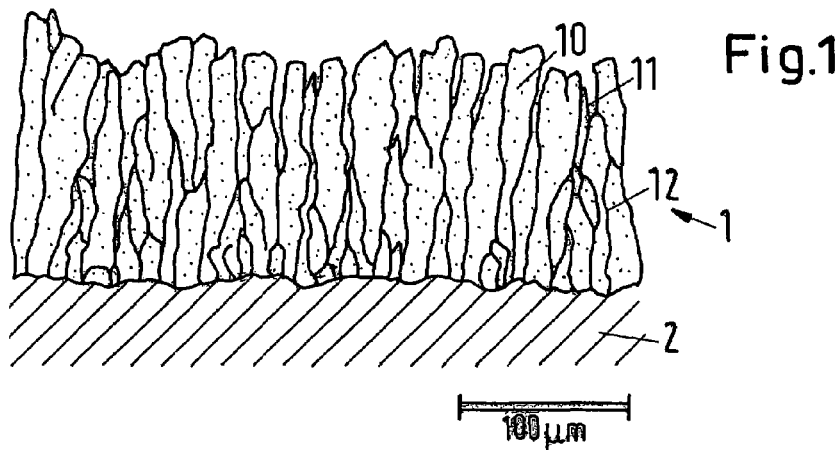
Fig.1
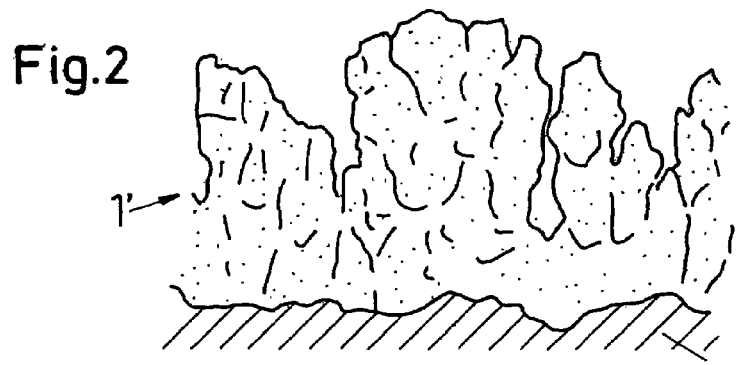
Fig.2
Fig.3
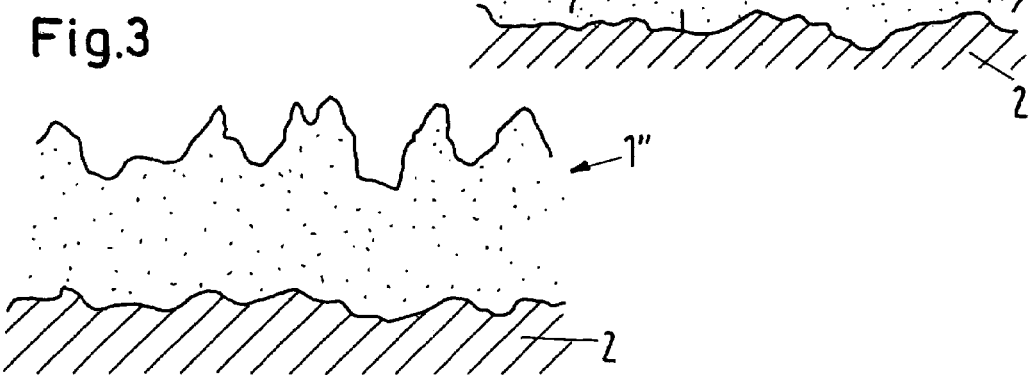
Fig.4
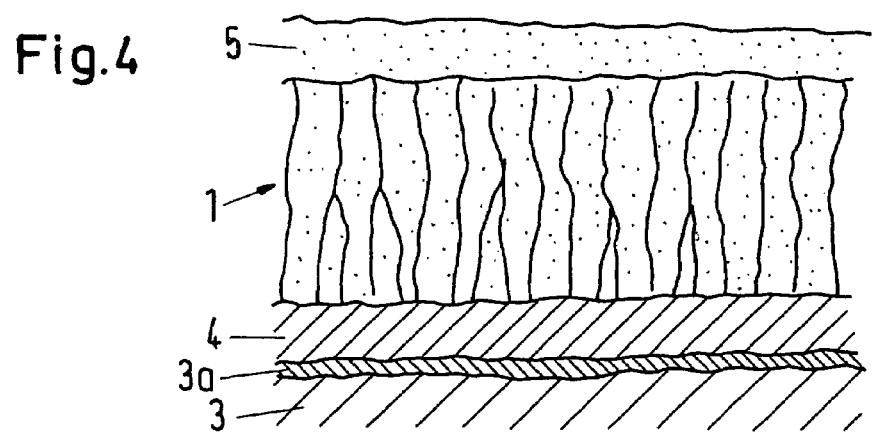

PLASMA SPRAYING METHOD

BACKGROUND OF THE INVENTION

The invention relates to a plasma spraying method. The generic process, described in U.S. Pat. No. 5,853,815, is a thermal spraying for the manufacture of a so-called LPPS (=low pressure plasma spraying) thin film. The invention also relates to applications of the method and to components which are coated in accordance with the method in accordance with the invention.

A conventional LPPS plasma spraying process is modified in the technical process by the LPPS thin film process, with a space through which plasma flows ("plasma flame" or "plasma beam") being expanded due to the changes and extended to a length of up to 2.5 m. The geometrical extension of the plasma results in a uniform expansion—a "defocusing"—of a powder beam which is injected into the plasma with a delivery gas. The material of the powder beam, which disperses to form a cloud in the plasma and is partly or fully melted there, reaches a widely extended surface of a substrate in a uniform distribution. A thin film is formed on the substrate having a coating thickness that is less than 10 μm which forms a compact covering due to the uniform distribution. A thicker coating with special features can be produced by a multiple application of thin films, which makes such a coating usable as a functional coating. A porous coating can, for example, be produced using a multiple application and is suitable as a support for catalytically active materials (see EP-A-1 034 843).

A functional coating, which is applied to a base body forming the substrate, as a rule includes different part coatings. For example, for a gas turbine (stationary gas turbine or airplane power plant), which is operated at high process temperatures, the blades are coated with a first single coating or multi-layer part coating which produces resistance to hot gas corrosion. A second coating, which is applied to the first part coating and for which ceramic material is used, forms a heat insulating coating. The LPPS plasma spraying process is suitable for the manufacturing of the first coating. The heat insulation coating is advantageously produced with a process in which a coating with a columnar micro-structure is created. The coating thus structured is composed approximately of cylindrical small bodies or particles whose central axes are aligned perpendicular to the substrate surface. Transitional zones in which the density of the deposited material is lower than in the particles bound the particles at the side. A coating which has an anisotropic micro-structure in this manner is tolerant in expansion with respect to changing strains which result due to repeatedly occurring temperature changes. The coating reacts to the changing strains in a largely reversible manner, i.e. without forming cracks, so that its service life can be considerably extended in comparison with the service life of a customary coating having no columnar micro-structure.

The anisotropic micro-structure can be produced using a thin-film method such as a vapor deposition method. In this process, which is termed "EB PVD" (electron beam physical vapor deposition), the substance to be deposited for the heat insulating coating is brought into the vapor phase by an electron beam in a high vacuum and condensed from the phase onto the component to be coated. If the process parameters are suitably selected, a columnar micro-structure thus results. A disadvantage of this vapor deposition process is the high plant cost. In addition, the same tool cannot be used for the LPPS plasma spraying process and for the EB PVD process in the manufacture of a coating including a plurality of partial coatings. A plurality of work cycles must therefore be carried out for the coating.

SUMMARY OF THE INVENTION

It is an object of the present invention to provide a plasma spraying method with which a heat insulating coating can be produced and which allows a coating, which includes the heat insulating coating as a part coating, to be applied to a substrate in one working cycle. This object is satisfied by the plasma spraying method described below.

The plasma spraying method is a coating method in which a material to be coated is sprayed onto a surface of a metallic substrate in the form of a powder beam. The coating material is injected into a plasma defocusing the powder beam at a low process pressure, which is lower than 10,000 Pa and is partly or fully melted there, with a plasma being produced with a sufficiently high specific enthalpy so that a substantial portion—amounting to at least 5% by weight—of the coating material changes to the vapor phase and an anisotropically structured coating is formed on the substrate. An anisotropically structured layer of the coating material is deposited on the substrate. In this coating, elongate particles, which form an anisotropic micro-structure, are aligned standing largely perpendicular to the substrate surface. Low-density transitional zones delimit the particles from one another.

The method in accordance with the invention has a further advantage with respect to the known method with which a coating structured in a columnar manner is produced by means of EB PVD in that the process times for coatings of the same thickness are a lot shorter.

Process parameters and conditions of various embodiments of the plasma spraying method in accordance with the invention are described in more detail below. Application possibilities for the method in accordance with the invention, as well as components coated in accordance with the embodiments of the present invention, are also described below.

The invention will be described in the following with reference to the drawings.

BRIEF DESCRIPTION OF THE DRAWINGS

FIG. 1 shows an anisotropically structured coating, manufactured by the method in accordance with the invention and drawn in accordance with a grinding pattern;

FIG. 2 shows a corresponding second coating which has been formed after an unfavorable change of a process parameter;

FIG. 3 shows a third coating, in which an anisotropic micro-structure can no longer be recognized after a further change of the same process parameter; and FIG. 4 shows a schematic representation of a coating system comprising a heat insulation coating.

DESCRIPTION OF THE PREFERRED EMBODIMENTS

In FIG. 1, a section is shown through a coating 1 which was made using the method in accordance with the invention and which is drawn in accordance with a grinding pattern. The coating 1 deposited onto a substrate 2 with the LPPS thin film process has an anisotropic structure and a coating thickness of around 150 μm. The anisotropic micro-structure is formed by elongate particles 10 which stand largely perpendicular to the substrate surface. Low material transitional zones 12, which are drawn as lines, and gap-shaped intermediate spaces 11 bound the particles 10 from one another. Zirconium oxide stabilized with yttrium Y, namely $ZrO_2$-8% $Y_2O_3$, were used as the coating material. The substrate 2 is as a rule an adhesion promoting coating or a protection coating against corrosion.

So that the anisotropic micro-structure arises, a plasma must be produced with sufficiently high specific enthalpy so that a substantial portion—amounting to at least 5% by weight, of the coating material changes into the vapor phase. The portion of the vaporized material which may not fully change into the vapor phase can amount to up to 70%. The plasma is produced in a burner with an electrical DC current and by means of a pin cathode or of a ring-like anode. The power supplied to the plasma, the effective power, must be determined empirically with respect to the resulting coating structure. The effective power given by the difference between the electrical power and the heat led away by cooling is, according to experience, in the range from 40 to 80 kW.

For the process pressure of the plasma spraying method in accordance with the invention, a value between 50 and 2000 Pa is selected, preferably between 100 and 800 Pa. A powder beam is injected into the plasma with a delivery gas. The process gas for the production of the plasma is a mixture of inert gases, in particular a mixture of argon Ar and helium He, with the volume ratio of Ar to He advantageously lying in the range from 2:1 to 1:4. The total gas flow is in the range from 30 to 150 SLPM (standard liters per minute). The powder conveying rate lies between 5 and 60 g/min, preferably between 10 and 40 g/min. The powder beam is shaped into a cloud of vapor and particles in the defocusing plasma. The substrate is preferably moved with rotating or pivoting movements relative to this cloud during the material application. In this connection, the heat insulating coating is built up by depositing a plurality of layers. The total coating thickness has values between 20 and 1000 μm, preferably values of at least 100 μm.

An oxide ceramic material, or a material which includes oxide ceramic components, is suitable for the manufacture of a heat insulating coating using the method in accordance with the invention, with the oxide ceramic material being in particular a zirconium oxide, in particular a zirconium oxide which is fully or partly stabilized with yttrium, cerium or other rare earths. The material used as the stabilizer is added to the zirconium oxide as an alloy in the form of an oxide of the rare earths, for example yttrium Y, cerium or scandium, with—for the example of Y—the oxide forming a portion of 5 to 20% by weight.

So that the powder beam is reshaped by the defocusing plasma into a cloud of vapor and particles from which a coating results with the desired micro-structure, the powdery starting material must be of a very fine grain. The size distribution of the powder particles is determined by means of a laser scattering method. For this size distribution, it must apply that it lies to a substantial portion in the range between 1 and 50 μm, preferably between 3 and 25 μm. Various methods can be used to manufacture the powder particles: for example spray drying or a combination of melting and subsequent breaking and/or grinding of the solidified melt.

With the coating shown in FIG. 1, which shows a well-formed columnar micro-structure, the following values were used for the process parameters: process pressure=150 Pa; process gas=Ar, 35 SLPM, and He, 60 SLPM; powder conveying: conveying rate=20 g/min; spray distance=900 mm.

After an increase of the conveying rate to 40-50 g/min, and without the other parameters being changed, the coating 1' shown in FIG. 2 is obtained. The micro-structure is still formed in a columnar fashion in part; however, it is no longer suitable for use as a heating insulating coating with very high resistance with respect to thermal changing stress.

After a further increase of the conveying rate to values larger than 60 g/min—see coating 1" in FIG. 3—the columnar micro-structure has completely disappeared. An increase of the process pressure or of the gas flow results also results in a disappearance of the columnar micro-structure. Interestingly, a profiled surface is formed with very pronounced rises, with these having been formed over rises of the substrate 2. It can also be recognized from coatings 1, 1' of FIGS. 1 and 2 that a similar connection exists between the anisotropic micro-structure and the surface profile of the substrate 2: the elongate particles 10 preferably start from rises of the substrate 2.

The heat insulating coating system shown schematically in FIG. 4 was applied to a base body 3 by means of LPPS thin film processes. This coating system is comprised of a barrier coating 3a, a hot gas corrosion protection coating 4, a heat insulating coating 1 on a ceramic base and applied in accordance with the invention, and a cover coating 5 which, as a smoothing coating, improves the erosion resistance. Additionally, a protection coating (not shown) on an oxide base can be provided between the hot gas corrosion protection coating 4 and the heat insulating coating 1.

The base coating consisting of the barrier coating 3a and the hot gas corrosion protection coating 4 has a coating thickness whose value is between 10 and 300 μm, preferably between 25 and 150 μm. For the barrier coating 3a, an NiAl alloy or an NiCr alloy is, for example, deposited on the base body 3 which can consist of an Ni or Co base alloy. The hot gas corrosion protection coating 4 in particular consists, at least in part, of a metal aluminide, of an MeCrAlY alloy, with Me standing for one of the metals Fe, Co or Ni or of a ceramic oxide material. It preferably has an either dense, columnar, directional or unidirectional structure. The base coating 3a, 4 forms the substrate of the heat insulating coating 4 which is produced in accordance with the invention and thus has a columnar micro-structure. The smoothing coating 5, whose coating thickness has a value between 1 and 50 μm, preferably between 10 and 30 μm, consists in particular at least in part of the same material as or of a similar material to the heat insulating coating. The part layers of the coating system are preferably all applied in a single work cycle without interruption by LPPS thin film processes. After the application, the coating system can be heat treated as a whole.

In the plasma spraying process of the invention an additional heat source can also be used in order to carry out the deposition of the coating material within a predetermined temperature range. The temperature is preset in the range between 300 and 900° C., preferably in the temperature range 450 to 750° C. An infrared lamp or plasma jet can, for example, be used as an auxiliary heat source. In this arrangement a supply of heat from the heat source and the temperature in the substrate which is to be coated can be controlled or regulated independently of the already named process parameters. The temperature control can be carried out with usual measuring methods (using infrared sensors, thermal sensors, etc.).

The method in accordance with the invention can be used to coat components exposed to high process temperatures with a heat insulating coating system. Such components are, for example, components of a stationary gas turbine or of an airplane power plant: namely turbine blades, in particular guide blades or runner blades, or even components which can be exposed to hot gas such as a heat shield.

A porous support structure for catalytically active materials can also be produced using the plasma spraying method in accordance with the invention and can be used in a heterogenic catalyst.

The invention claimed is:

1. A method of forming a thermally insulating layer system on a metallic substrate surface, comprising:
   forming a plasma beam;
   introducing a coating material in the form of a powder having particles in the range between 1 and 50 µm, carried by a delivery gas into the plasma beam, so as to form a powder beam;
   defocusing the powder beam by using the plasma beam with a sufficiently high specific enthalpy and by maintaining a process pressure between 50 and 2000 Pa for at least partially melting some of the powder and vaporizing at least 5% by weight of the powder, so as to form a vapor phase cloud; and
   forming from the vapor phase cloud onto the metallic substrate surface an insulating layer, being a part of said insulating layer system, having an anisotropic columnar microstructure having elongate particles;
   wherein said anisotropic columnar microstructure is aligned substantially perpendicular to the metallic substrate surface and low-density transition regions with little material delimit the elongate particles relative to one another.

2. The method of claim 1, wherein said forming a thermally insulating layer system on a metallic substrate surface comprises using a low pressure plasma spray (LPPS) system.

3. The method of claim 1, wherein said plasma beam with a sufficiently high specific enthalpy comprises a plasma beam having an effective power in the range between 40 and 80 kW.

4. The method of claim 1, comprising maintaining a process pressure between 100 and 800 Pa.

5. The method of claim 1, wherein the process gas for the generation of the plasma beam comprises a mixture of inert gases with a total flow in the range between 30 and 150 SPLM.

6. The method of claim 5, wherein the mixture of inert gases comprises argon and helium, with the volume ratio of argon to helium preferably amounting to 2:1 to 1:4.

7. The method of claim 1, wherein the powder supply rate of the coating material is between 5 and 60 g/min.

8. The method of claim 1, wherein the powder supply rate of the coating material is between 10 and 40 g/min.

9. The method of claim 1, wherein the thermally insulating layer is used in a gas turbine and its layer thickness is the range between 20 and 1000 µm.

10. The method of claim 1, wherein the thermally insulating layer is used in a gas turbine and its layer thickness is at least 100 µm.

11. The method of claim 1, comprising moving the substrate during said forming an insulating layer, with a rotary movement relative to the vapor phase cloud.

12. The method of claim 1, comprising moving the substrate during said forming an insulating layer, with a pivoting movement relative to the vapor phase cloud.

13. The method of claim 1, wherein said coating material comprises oxide ceramic components, wherein an oxide ceramic component of the coating material is a zirconium oxide completely or partly stabilized with yttrium, cerium or other rare earths and wherein the material used as a stabilizer is alloyed with the zirconium oxide in the form of an oxide of said rare earths.

14. The method of claim 13, wherein the size distribution of the powder particles of the coating material is determined by means of a laser scattering method, with spray drying or a combination of melting and subsequent breaking and/or grinding being used as a method for the manufacture of the power particles.

15. The method of claim 13, wherein the size distribution of the powder particles of the coating material is determined by means of a laser scattering method and wherein this size distribution lies substantially in the range between 3 and 25 µm, with spray drying or a combination of melting and subsequent breaking and/or grinding being used as a method for the manufacture of the power particles.

16. The method of claim 1, further comprising using an additional heat source so as to carry out said forming from the vapor phase cloud onto the metallic substrate surface an insulating layer, within a predetermined temperature range, with a heat input of the heat source and the temperature in the substrate being controlled independently of said process pressure, and said plasma enthalpy.

17. The method of claim 16, wherein the thermally insulating layer system comprises, apart from the thermally insulating layer, a base layer between a base body and the thermally insulating layer and a cover layer on the thermally insulating layer, wherein
   a) the base layer includes a hot gas corrosion protection layer, the layer thickness of which has a value between 10 and 300 µm, and which comprises at least partly of either a metal aluminide, of a MeCrAlY alloy, with Me signifying one of the metals Fe, Co or Ni, or of an oxide ceramic material and has an either dense columnar or uniformly directed structure,
   b) the cover layer is a smoothing layer, the layer thickness of which has a value between 1 and 50 µm, and which comprises at least partly of the same or a similar material to the thermally insulating layer, and
   c) the part layers of the layer system are all applied in a single working cycle.

18. The method of claim 16, wherein the thermally insulating layer system includes, apart from the thermally insulating layer, a base layer between a base body and the thermally insulating layer and a cover layer on the thermally insulating layer, wherein
   a) the base layer includes a hot gas corrosion protection layer, the layer thickness of which has a value between 25 and 150 µm, and which comprises at least partly of either a metal aluminide, of a MeCrAlY alloy, with Me signifying one of the metals Fe, Co or Ni, or of an oxide ceramic material and has an either dense columnar or uniformly directed structure,
   b) the cover layer is a smoothing layer, the layer thickness of which has a value between 10 and 30 µm, and which comprises at least partly of the same or a similar material to the thermally insulating layer, and
   c) the part layers of the layer system are all applied in a single working cycle.

19. The method of claim 1, wherein the substrate comprises a nickel or cobalt based alloy.

20. The method of claim 1, further comprising thermally treating the thermally insulating layer system.

21. The method of claim 1, wherein the substrate is a turbine blade of a stationary gas turbine or of an aircraft engine.

22. The method of claim 1, wherein the substrate is a guide vane or rotor blade or a component acted on by hot gas.

23. The method of claim 1, wherein the substrate is a heat shield in an aircraft engine.

* * * * *